US00RE40965E

(19) United States
(12) Reissued Patent
Kaneko et al.

(10) Patent Number: US RE40,965 E
(45) Date of Reissued Patent: Nov. 10, 2009

(54) METHOD OF FORMING LOW-RESISTANCE CONTACT ELECTRODES IN SEMICONDUCTOR DEVICES

(75) Inventors: Shuichi Kaneko, Saitama-ken (JP); Hironori Aoki, Tokyo (JP); Akio Iwabuchi, Tokyo (JP)

(73) Assignee: Sanken Electric Co., Ltd. (JP)

(21) Appl. No.: 11/065,718

(22) Filed: Feb. 24, 2005

Related U.S. Patent Documents

Reissue of:
(64) Patent No.: 6,524,949
Issued: Feb. 25, 2003
Appl. No.: 10/003,192
Filed: Oct. 29, 2001

(30) Foreign Application Priority Data

Jan. 26, 2001 (JP) ..... 2001-018641

(51) Int. Cl.
*H01L 21/4763* (2006.01)

(52) U.S. Cl. ..... 438/640; 438/624; 438/632

(58) Field of Classification Search ..... 438/640, 438/624, 632
See application file for complete search history.

(56) References Cited

U.S. PATENT DOCUMENTS

| | | | | |
|---|---|---|---|---|
| 4,807,016 | A | 2/1989 | Douglas | 357/67 |
| 5,286,677 | A | 2/1994 | Wu | 437/195 |
| 5,759,869 | A | 6/1998 | Chen et al. | 437/195 |
| 6,524,949 | B2 | 2/2003 | Kaneko et al. | 438/640 |

*Primary Examiner*—Walter L Lindsay, Jr.
(74) *Attorney, Agent, or Firm*—Woodcock Washburn LLP

(57) ABSTRACT

There is formed on a semiconductor substrate a lamination of a first insulating film of nondoped silicon glass or the like and, on this first insulating film, a second insulating film of boron phosphor silicate glass or the like, with a conductor layer between the two insulating films. A hole is first dry-etched in the second insulating film, leaving the substrate surface covered by the first insulating film. Then the second insulating film is heated to a reflow temperature such that the hole is thermally deformed, flaring as it extends away from the insulating film. Then a second hole is dry-etched in the first insulating film through the first recited hole in the second insulating film, with the consequent exposure of the semiconductor surface. Then a contract electrode is fabricated by filling the first and the second hole with an electroconductive material into direct contact with the substrate surface. Being covered by the first insulating film, the substrate surface is not to be contaminated with impurities during the heating of the second insulating film.

3 Claims, 2 Drawing Sheets

METHOD OF FORMING LOW-RESISTANCE CONTACT ELECTRODES IN SEMICONDUCTOR DEVICES

Matter enclosed in heavy brackets [ ] appears in the original patent but forms no part of this reissue specification; matter printed in italics indicates the additions made by reissue.

BACKGROUND OF THE INVENTION

The present invention relates to a method of fabricating contact electrodes in semiconductor devices such as integrated circuits, transistors, and diodes. The method of this invention is particularly well applicable to the fabrication of contact electrodes in power-handling semiconductor devices in which the insulating films to be penetrated are generally thicker than in other semiconductor devices.

As semiconductor devices have grown finer in design in recent years, so have become less in size the contact holes that must be formed in and through their insulating films for creation of electrodes. In addition to that, at least as far as power-handling semiconductor devices are concerned, the insulating films in which are to be formed the contact holes remain relatively thick in order to withstand high voltages. The so-called aspect ratio of the contact holes, the ratio of hole depth to diameter, have become all the more higher in this type of semiconductor devices, making it proportionately more difficult to fill metal, such as aluminum, into these holes. An incomplete packing of the contact holes with metal is of course undesirable from the standpoint of reduction of contact resistance to a minimum.

A conventional remedy to this problem is what is known as the contact reflow process, which starts with the creation of a hole in a film of electrically insulating material on a semiconductor substrate, as by the more conventional method of photolithography or etching. The insulating film may be of either boron-phosphor-silicate glass (BSPG) or phosphor-silicate glass (PSG). Anisotropic etching is considered desirable for creation of a hole that extends approximately perpendicular to the substrate surface.

The next step is the heating of the insulating film to such a temperature that it undergoes deformation, or reflow, with the consequent flaring of the hole as it extends away from the substrate surface, or tapering thereof as it extends toward the substrate surface. Even though the insulating film may be relatively thick, and the original hole correspondingly high in aspect ratio, the tapering contact hole thus formed is bound to accept metal far more easily and more thoroughly than if it were constant in diameter, as the metal is introduced as by vacuum deposition. The result is an improvement in the so-called step coverage of the electrode.

The contact reflow process has its own shortcoming, however. Upon heating, as above, of the insulating film to a reflowing temperature following the creation of a hole therein, there occurs the so-called outward diffusion of such substances as phosphor and boron contained therein. These substances, especially boron, find their way onto the substrate surface exposed through the contact hole thereby preventing favorable electrical contact of the electrode with the substrate.

An obvious solution to this weakness of the contact reflow process might seem to create, as by thermal oxidation, a silicon oxide film on the substrate surface forming the bottom of the contact hole, preparatory to the heat treatment of the insulating film. This solution would be impractical because the noted outward diffusion of boron and the like would occur during creation of the silicon oxide film, to such an extent that the substrate surface would not be satisfactorily kept from contamination by the impurities.

SUMMARY OF THE INVENTION

The present invention represents an improvement of the contact reflow method, aiming specifically at preventing the outward diffusion of the impurities contained in the insulating film or films and reducing the contact resistance to an absolute minimum.

The invention also seeks to attain the first recited object in the simplest possible manner, without unnecessarily adding to the steps of electrode fabrication.

Briefly, the present invention may be summarized as a method of fabricating a contact electrode in a semiconductor device. There is first formed on a surface of a semiconductor substrate a lamination of a first and a second insulating film of different materials, possibly with any required conductor layer interposed therebetween. Then a first hole is etched at least in the second insulating film which overlies the first insulating film, thereby leaving the substrate surface covered by at least part of the thickness dimension of the first insulating film. Then the second insulating film is heated to a reflowing temperature such that the first hole in the second insulating film is so reshaped as to flare as it extends away from the first insulating film. Then a second hole is etched in the first insulating film through the first hole in the second insulating film, with consequent exposure of the substrate surface at the bottom of the second hole. Then a contact electrode is formed by filling the first and the second hole with an electroconductive material.

It is to be noted that two insulating films of different materials are formed on the semiconductor substrate according to the invention. A hole is first etched in the overlying second insulating film, leaving the substrate surface covered by the first insulating film during the subsequent reflow treatment of the second insulating film. This first hole is therefore deformed into a tapering shape without the least possibility of the substrate surface being contaminated by the impurities dispersed from the second insulating film. Fabricated following the subsequent creation of the second hole in the first insulating film through the first hole, the contact electrode is predestined to make low-resistance contact with the substrate surface forming the bottom of the second hole.

For successfully creating the first hole so as to leave the substrate surface covered by at least part of the thickness dimension of the first insulating film, it is recommended that materials for the two insulating films and an etchant for use be so chosen in relation to one another that the first insulating film is slower to be etched than the second. With the first insulating film thus left shielding the substrate surface by taking advantage of the difference between the etching rates of the two insulating films, the contamination of the substrate surface will be prevented without unnecessarily complicating the process of electrode fabrication.

It will also be appreciated that the tapering shape of the first hole remains intact upon creation of the second hole down to the substrate surface. Thus the invention saves the advantages of the prior art reflow process.

The above and other objects, features and advantages of this invention will become more apparent, and the invention itself will best be understood, from a study of the following detailed description and appended claims, with reference had to the attached drawings a preferred mode of carrying out the invention.

DETAILED DESCRIPTION OF THE INVENTION

Figure 1:
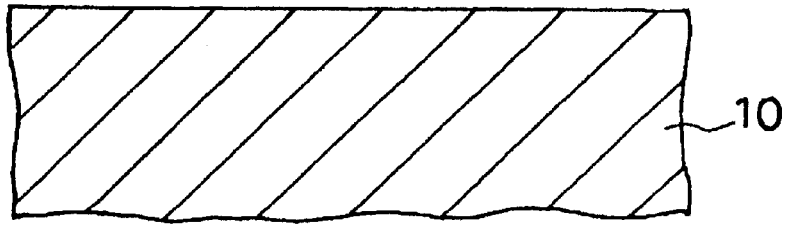
FIGS. 1 through 6 is a series of schematic illustrations sequentially showing the steps of fabricating a low-resistance contact electrode on a semiconductor device by the method of this invention.

There may be first prepared a semiconductor substrate 10, FIG. 1, in the form of a single crystal of silicon. Although the showing of this figure, as well as the showings of all the figures that follow, is highly simplified to illustrate the invention in its simplest form, it is understood that the substrate 10 has a plurality of semiconductor regions formed as by diffusion or epitaxial growth for fabrication of desired semiconductor devices such as transistors and diodes.

Figure 2:
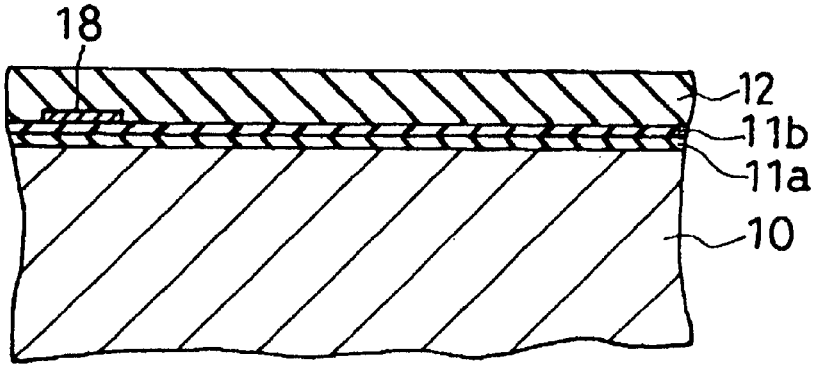

Then, as shown in FIG. 2, a first insulating film 11 of nondoped silicon glass (NSG) is formed on one major surface of the semiconductor substrate 10 as by familiar chemical vapor deposition. Then a conducting layer 18 is formed on part of the first insulating film 11 for use in electrical connection of the semiconductor device. Then a second insulating film 12 of BSPG is formed, also as by chemical vapor deposition, on the entire surface of the first insulating film 11, inclusive of that of the conducting layer 18. The first insulating film 11 may be approximately 0.2–0.7 micrometer, and the second insulating film 12 approximately 0.5–1.8 micrometers, in thickness. The first insulating film 11 is higher in melting point than the second 12. Functionally, the two insulating films 11 and 12 serve to insulate the conductor layer 18 from the conductor or semiconductor regions within the substrate 10 and from the conductors, not shown, to be formed on the insulating film 12.

Figure 3:
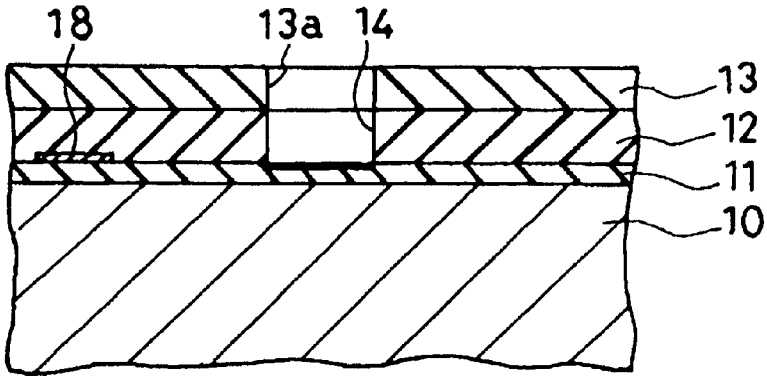

Then the second insulating film 12 is masked with an etchant resist 13, FIG. 3, which has defined therein an opening 13a through which a contact hole is to be formed. The second insulating film 12 is subsequently etched through the masking of the etchant resist 13 to have a hole 14 created therein just under the etchant resist opening 13a. The etching process employed here is dry etching, with use of a gaseous etchant that can etch the second insulating film 12 so much faster than the first insulating film 11 that, as depicted also in FIG. 3, the first insulating film mostly, but perhaps not wholly, remains intact as the hole 14 is created all through the second insulating film. The known reactive ion etching process, using an anisotropic gas etchant, is particularly preferred for the purposes of the invention. The etching gas in use may be that containing carbon and fluorine as in the form of fluoroform or trifluoromethane, $CHF_3$, or tetrafluoromethane or carbon tetrafluoride, $CF_4$.

A closer study of FIG. 3 will reveal that the first insulating film 11 is shown slightly removed by the above etching process. This showing is to indicate that such partial etching of the first insulting film 11, along with the complete etching of the required part of the second insulating film 12, is allowable in practice. All that is required at this juncture is that the surface of the substrate 10 remain covered by the first insulating film 11, either by part or whole of its thickness dimension. It will also be observed from FIG. 3 that the hole 14 is of practically constant diameter, extending normal to the surface of the substrate 10, thanks to the anisotropic etching process employed.

Figure 4:
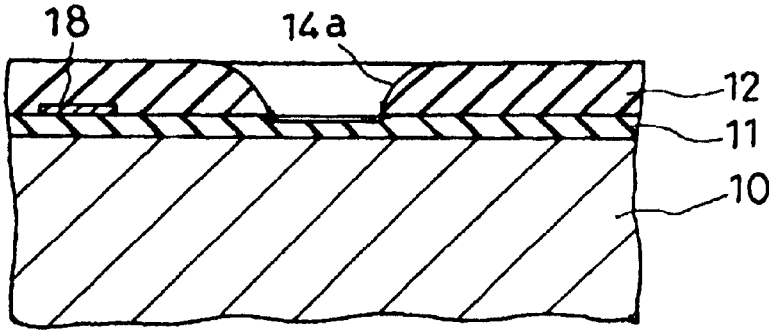

Then, following the removal of the etchant resist 13, the second insulating film 12 is heated to a temperature range of approximately 900°–1000° C. Thereupon, as has been set forth in conjunction with the conventional contact reflow process, the second insulating film 12 of BSPG will be thermally caused to reflow with the consequent reshaping of the constant-diameter hole 14 into a hole 14a, FIG. 4, that flares as it extends away from the remaining first insulating film 11, or, speaking conversely, tapers as it extends toward the same. Fabricated from NSG, the first insulating film 11 will be unaffected by this heat treatment of the second insulating film 12. The heat treatment will, besides reshaping the hole 14, cause the noted outward diffusion of the phosphor and boron contained in the second insulating film 12. Unlike the prior art process, however, these diffusing impurities will not contaminate the surface of the silicon substrate 10 through the hole 14a, the substrate surface being still left covered by at least part of the thickness dimension of the first insulating film 11.

Figure 5:
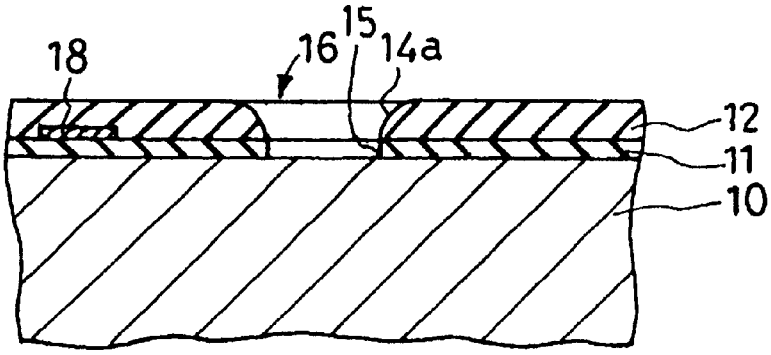

Then a hole 15, FIG. 5, is created as by dry etching in the first insulating film 11 in register with the tapering hole 14a in the second insulating film 12. The second insulating film 12 serve to mask the first insulating film 11. This hole 15 will be hereinafter referred to as the second hole, and the tapering hole 14a as the first hole. Preferably, the second hole 15 may also be formed by the known reactive ion etching process with use of a gaseous etchant containing $CHF_3$ and $CF_4$, in order that the second hole may extend normal to the surface of the substrate 10 as shown. Formed in this manner, the second hole 15 will constitute a streamlined extension of the first hole 14a, both holes being practically equal in diameter at the junction between the two insulating films 11 and 12. The reference numeral 16 in FIG. 5 generally denotes the contact hole comprised of the first hole, or first hole part, 14a which tapers as it extends through the second insulating film 12 toward the first insulating film 11, and the second hole, or second hole part, 15 which extends with a constant diameter through the first insulating film down to the surface of the substrate 10.

Figure 6:
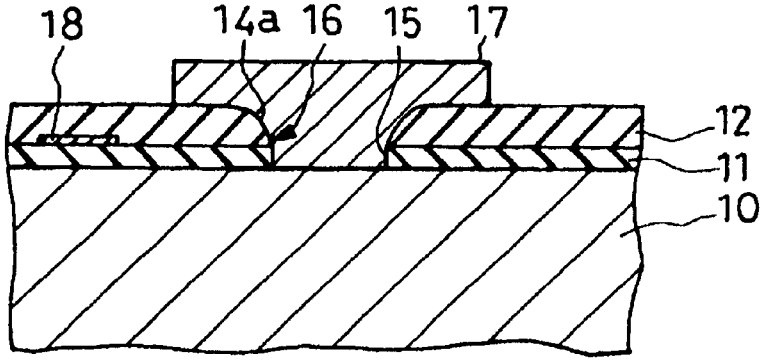

Next comes the step of the creation of a metal-made contact electrode 17, FIG. 6, in the contact hole 16. Formed as by vacuum deposition of aluminum, the electrode should overfill the contact hole 16, making low-resistance contact with the surface of the substrate 10 and appropriately overflowing from the contact hole. Any required number of such contact electrodes, contacting different semiconductor regions, may be formed simultaneously in practice.

The advantages gained by the above-described exemplary method of this invention may be recapitulated as follows:

1. The electrode 17 has an improved stop coverage thanks to the funnel-shaped first part 14a of the contact hole 16.
2. Left covered by the first insulating film 11 during the heat treatment of the second insulating film 12 for creation of the tapering first hole part 14a, the substrate surface is protected from contamination by the impurities contained in the second insulating film 12. Consequently, the electrode 17 formed subsequently in the contact hole 16 infallibly makes low-resistance contact with the substrate surface.
3. Only the second insulating film 12 is etched away, leaving the first insulating film 11 covering the substrate surface, by taking advantage of a difference in etching rate between the two insulating films 11 and 12. The objective of preventing an increase in contact resistance due to the outward diffusion of the impurities is thus realized by the simplest possible method.

Notwithstanding the foregoing detailed disclosure it is not desired that the present invention be limited by the exact showing of the drawings or the description thereof. The following is a brief list of possible modifications of the illustrated exemplary method:

1. The second insulating film 12 only could be etched away for creation of the hole 14a, instead of etching part of the first insulating film 11, too, as in the representative method. This option is not recommended, however. For, should the second insulating film 12 partly remain at the bottom of the hole 14, this second insulating film might be so deformed, during the heat treatment for reshaping the hole 14 into the tapering hole 14a, as to fill the hole 14. This danger is eliminable by etching the second insulating film 12 all the way down to, and even partly into, the first insulating film 11 as through adjustment of the etching time.

2. An additional insulating film or films may be interposed as required between semiconductor substrate 10 and second insulating film 12.
3. The holes 14 and 15 could be formed by such familiar dry etching methods as sputter etching or ion beam etching, or even by wet etching.
4. The electrode 17 could be formed by plating.
5. The electrode 17 could be a lamination of two or more different materials.

All these and other changes and adaptations of the illustrated method are intended in the foregoing disclosure. It is therefore appropriate that the invention be construed broadly and in a manner consistent with the fair meaning or proper scope of the subjoined claims.

What is claimed is:

1. A method of forming a contact electrode in a semiconductor device, comprising the steps of:

providing a semiconductor substrate having a surface;

forming a first insulating film on the surface of the semiconductor substrate, the first insulating film comprising a nondoped silicon glass;

forming a second insulating film on the first insulating film, the second insulating film comprising a boron phosphor silicate glass;

creating a first hole at least in the second insulating film by [isotropic] *anisotropic* etching, thereby leaving the surface of the semiconductor substrate covered by at least part of the thickness dimension of the first insulating film, the first hole being created using a gaseous etchant such that the second insulating film is etched at a higher rate than the first insulating film, the etchant containing carbon and fluorine;

heating the second insulating film to a reflowing temperature whereby the first hole in the second insulating film is reshaped to flare as it extends away from the first insulating film;

creating a second hole in the first insulating film by [isotropic] *anisotropic* etching, with use of a second gaseous etchant containing $CHF_3$ and $CF_4$, the first insulating film through the first hole in the second insulating film, thereby exposing a part of the surface of the semiconductor substrate; and forming a contact electrode by filling the first and the second hole with an electroconductive material.

2. A method of forming a contact hole according to claim 1, wherein the first insulating film is from about 0.2 to about 0.7 micrometer in thickness, and the second insulating film from about 0.5 to 1.5 micrometers in thickness.

3. A method of forming a contact electrode according to claim 1, wherein the first insulating film is higher in melting point than the second insulating film.

* * * * *